US006258672B1

(12) United States Patent
Shih et al.

(10) Patent No.: US 6,258,672 B1
(45) Date of Patent: Jul. 10, 2001

(54) METHOD OF FABRICATING AN ESD PROTECTION DEVICE

(75) Inventors: Jiaw-Ren Shih; Jian-Hsing Lee; Huey-Liang Hwang, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/252,630

(22) Filed: Feb. 18, 1999

(51) Int. Cl.$^7$ .............................................. H01L 21/8234
(52) U.S. Cl. .................... 438/275; 438/276; 438/277; 438/278
(58) Field of Search ................... 438/275, 276, 438/277, 278

(56) References Cited

U.S. PATENT DOCUMENTS

| | | | |
|---|---|---|---|
| 5,237,395 | 8/1993 | Lee | 257/358 |
| 5,410,254 | * 4/1995 | Consiglio | 324/456 |
| 5,486,716 | * 1/1996 | Saito et al. | 257/360 |
| 5,504,362 | * 4/1996 | Pelella et al. | 257/357 |
| 5,532,178 | 7/1996 | Liaw et al. | 437/57 |
| 5,546,055 | * 8/1996 | Klughart | 331/116 FE |
| 5,654,663 | * 8/1997 | McClure et al. | 327/530 |
| 5,689,133 | 11/1997 | Li et al. | 257/361 |

* cited by examiner

Primary Examiner—Stephen D. Meier
Assistant Examiner—Jamie L. Brophy
(74) Attorney, Agent, or Firm—George O. Saile; Stephen B. Ackerman; Billy Knowles

(57) ABSTRACT

An ESD protection structure that when connected between an input/output pad on a semiconductor substrate and a reference voltage source, will protect internal circuits formed on the semiconductor substrate from over stress due to excessively high voltages of an ESD voltage source. The ESD protection structure has a uniform discharge current to prevent damage to the ESD protection device thus allowing increased protection to the internal circuits. The ESD protection device has at least one source region that is the emitters of parasitic transistors connected to the reference voltage source and at least one drain region that is the collectors of the parasitic transistors connected to the junction of the input/output pad and the internal circuitry. The ESD protection device further has at least one gate electrode formed above a channel region. The channel region is the region is between each of the source regions and the drain regions. The gate electrodes are connected to the reference voltage source. Each gate electrode has a variable length and thus the channel region has a variable length. The channel region is the base of the parasitic transistors formed by the ESD protection structure. The variable length of the channel region and thus the base of the parasitic transistors create an ESD current that is distributed uniformly over said ESD protection structure.

4 Claims, 8 Drawing Sheets

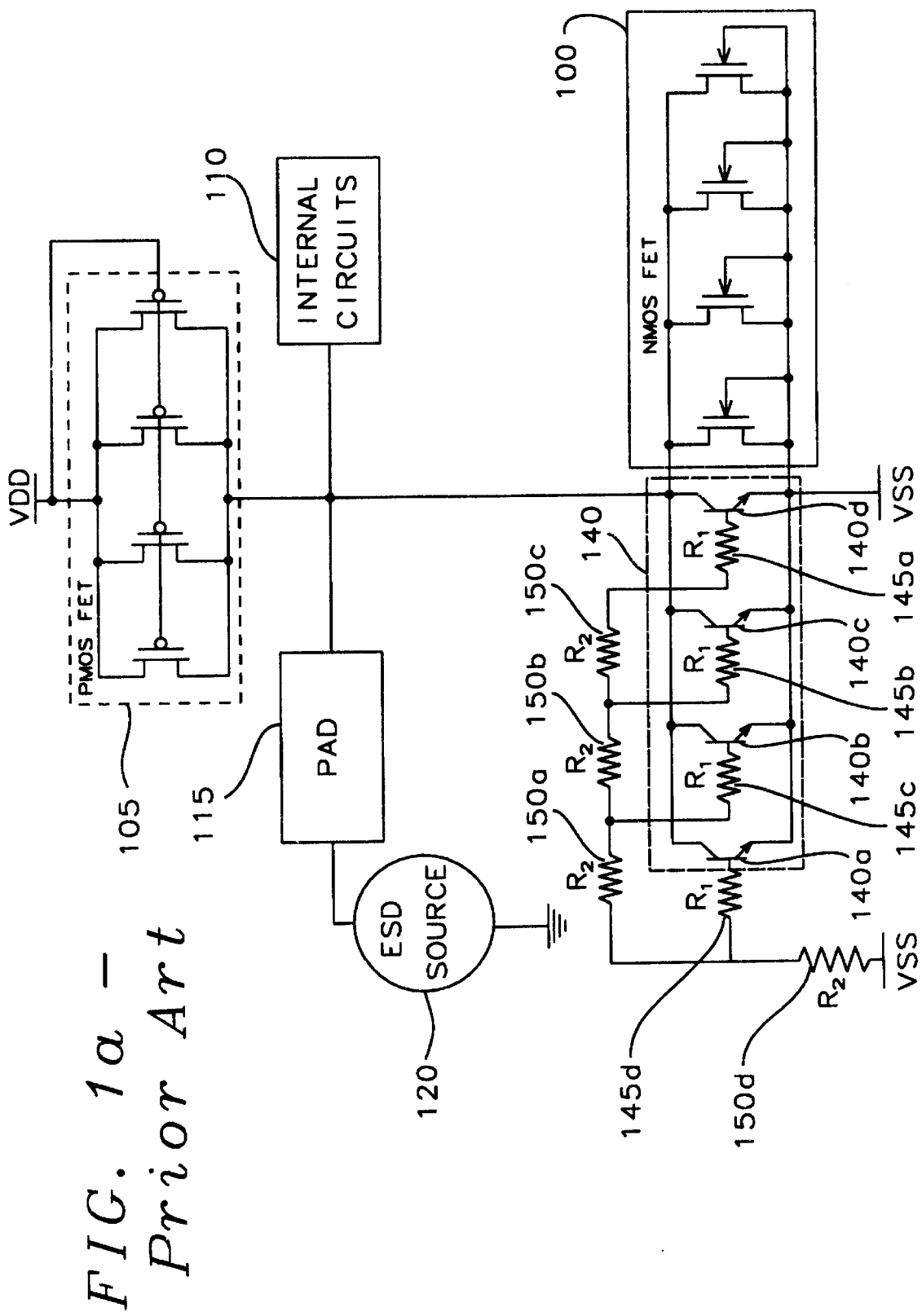
FIG. 1a – Prior Art

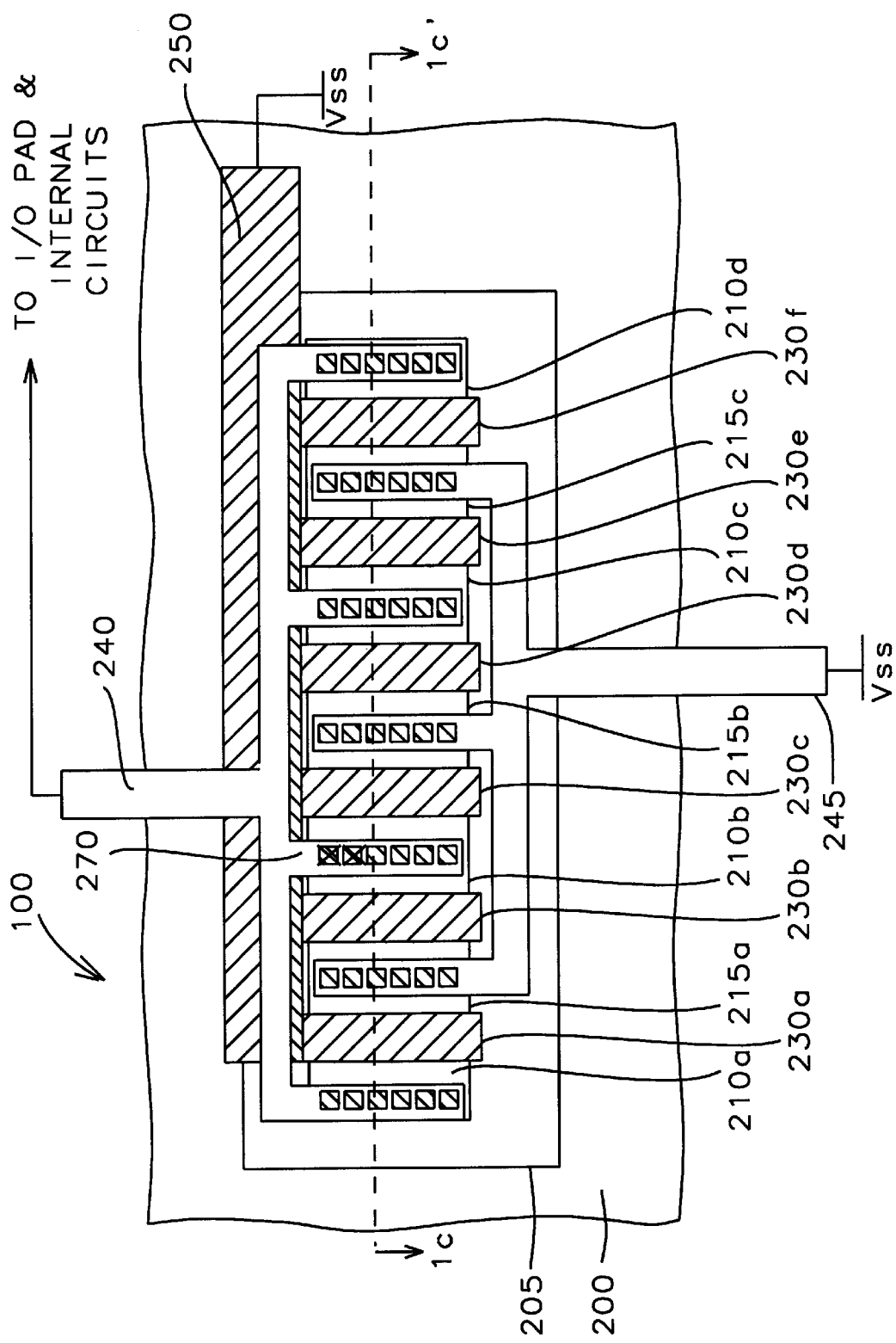
FIG. 1b – Prior Art

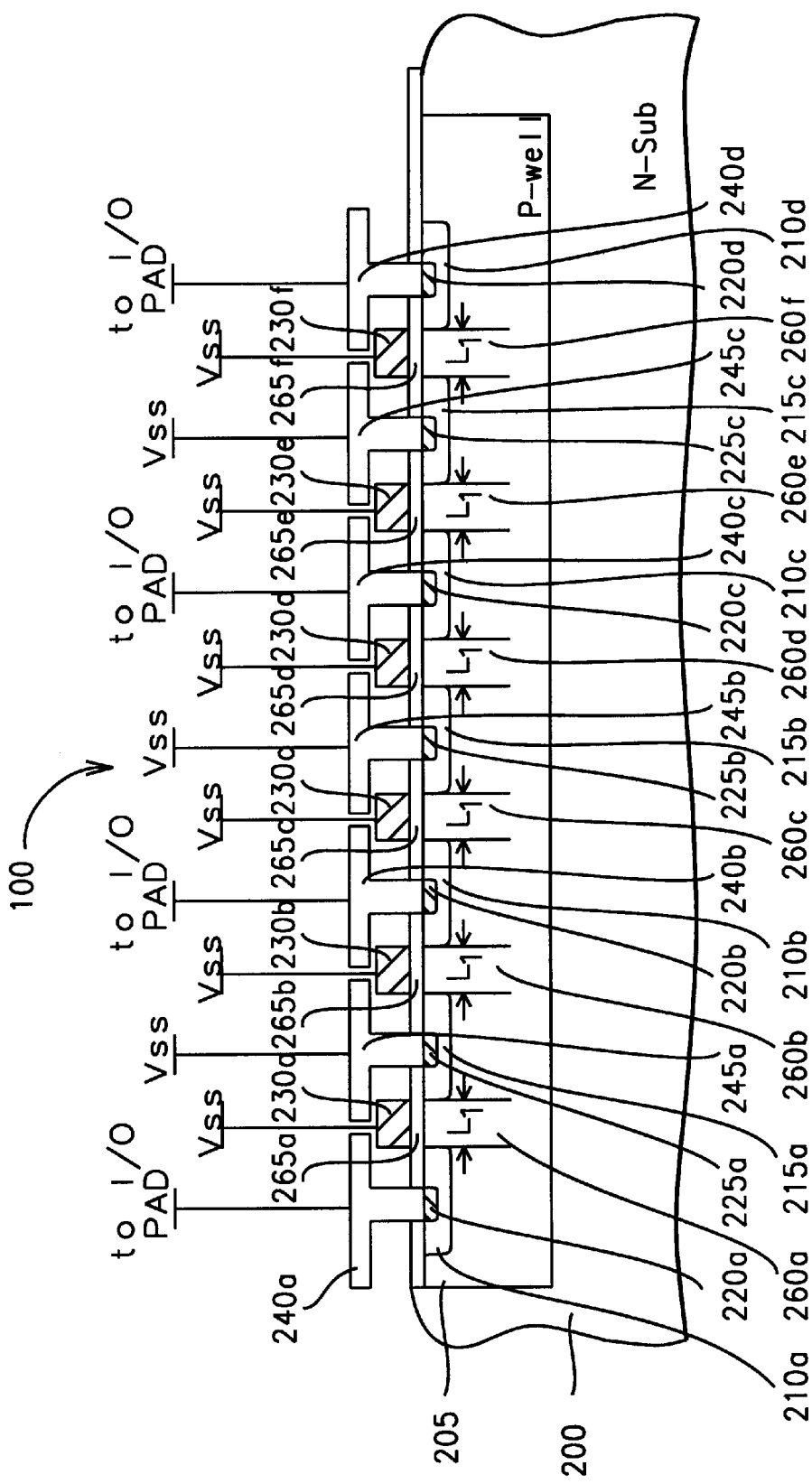
FIG. 1c – Prior Art

METHOD OF FABRICATING AN ESD PROTECTION DEVICE

BACKGROUND OF THE INVENTION

1. Field of the Invention

This invention is related to the protection of integrated circuits on a semiconductor substrate from voltage overstress due to pulses resulting from electrostatic discharge (ESD). More particularly, this invention is related to semiconductor devices and structures for improved protection of the integrated circuits.

2. Description of the Related Art

In FIG. 1a the N-channel metal oxide semiconductor (NMOS) field effect transistor (FET) 100 of the prior art is shown in an application, wherein it is configured as an ESD protection circuit. The drain of the NMOS FET 100 is connected to the input pad 115, the drain of the P-channel Metal Oxide Semiconductor (PMOS) FET 200, and to the internal circuits 110. The source and the gate of the PMOS FET 200 are connected to the voltage supply VDD. The source and gate of the NMOS FET 100 are connected to the substrate biasing voltage source Vss. The collectors of the parasitic bipolar junction transistors (BJT's) 140a, 140b, 140c, 140d are structurally the drain of the NMOS FET 100. The emitters of the parasitic BJT's 140a, 140b, 140c, 140d are structurally the source of the NMOS FET 100 which is connected to the substrate biasing voltage source Vss. The bases of the parasitic BJT's 140a, 140b, 140c, 140d are structurally the channel region of the NMOS FET 100 are connected to the parasitic resistors 145a, 145b, 145c, 145d that is formed by the bulk resistance of the semiconductor substrate. The parasitic resistors 145a, 145b, 145c, 145d, and 150a, 150b, 150c, 150d form a resistive network connected to the ground reference.

A positive ESD source 120 such as the human body or electrostatically charged machinery is momentarily coupled to the input/output pad 115. The magnitude of a voltage pulse of the ESD source 120 is on the order of 1,000 volts or larger. As the voltage of the ESD source 120 is transferred through the metal connections to the drain of the NMOS FET 100, the gate to drain voltage of the NMOS FET 100 is exceeds the breakdown voltage. The drain to the substrate junction starts to enter the avalanche breakdown condition and then starts to generate large amounts of electron - hole pairs. The holes pass through the substrate bulk resistances 145a, 145b, 145c, 145d, and 150a, 150b, 150c, 150d. The voltage drop across the substrate bulk resistances 145a, 145b, 145c, 145d, and 150a, 150b, 150c, 150d forward bias the source to substrate junction, causing it to emit electrons. This condition starts the parasitic BJT's 140a, 140b, 140c, 140d conducting. The substrate bulk resistances, 145a, 145b, 145c, 145d, and 150a, 150b, 150c, 150d are configured such that the base current of parasitic BJT's 140a and 140b are much larger than the base current of BJT's 140c and 140d. Since the base currents are directly related to the collector currents until the parasitic BJT's reach saturation, the currents of the parasitic BJT's 140a and 140b are much greater than the collector currents of the parasitic 140c and 140d. This differential of the collector currents commonly called current crowding can cause BJT's 140a and 140b to fail due to excessive current.

FIGS. 1b and 1c illustrate the top surface and cross-section of the NMOS FET 100 of FIG. 11a. A P-type material is implanted to a low concentration into the surface of the semiconductor substrate 200 to form the P-well 205. The P-well 205 forms an expitaxial area that is connected to the substrate biasing voltage source Vss. An N-type material is implanted to a high concentration to form the drain regions 210a, 210b, 210c, 210d of the NMOS FET 100. The N-type material is simultaneously implanted to a high concentration to form the source regions 215a, 215b, 215c of the NMOS FET 100.

The N-type material is further implanted to a very high concentration within the drain regions 210a, 210b, 210c, 210d and the source regions 215a, 215b, 215c, to form respectively low resistivity drain contact points 220a, 220b, 220c, 220d and low resistivity source contact points 225a, 225b, 225c.

An insulating material is deposited on the surface of the semiconductor substrate 200 in the channel regions 260a, 260b, 260c, 260d, 260e, 260f to form a gate oxide 265a, 265b, 265c, 265d, 265e, 265f. Above the gate oxide 265a, 265b, 265c, 265d, 265e, 265f a conductive material such as highly doped polycrystalline silicon is deposited to form the gates 230a, 230b, 230c, 230d, 230e, 230f of the NMOS FET 100.

A second conductive material such as a aluminum is then deposited on the surface of the semiconductor substrate 200 to form the connecting lands 240 that connect the drain regions 210a, 210b, 210c, 210d to the input/output pad and the internal circuits through the low resistivity drain contacts 220a, 220b, 220c, 220d. Simultaneously, the second conductive material is also deposited on the surface of the semiconductor substrate 200 to form the connecting lands 245 from the source regions 215a, 215b, 215c to the substrate biasing source Vss through the low resistivity source contacts 225a, 225b, 225c.

The first conductive material is further deposited to form the connecting land 250 that connects the gates 230a, 230b, 230c, 230d, 230e, 230f to the substrate biasing voltage source Vss.

As above described, when an ESD voltage source 120 of FIG. 1a is coupled to the input/output pad 115, the current crowding that results from nonuniform currents can cause the damage 270 shown.

U.S. Pat. No. 5,237,395 (Lee) describes an electrostatic discharge (ESD) protection circuit for protecting internal devices of an integrated circuit. The ESD protection circuit of Lee is coupled between the power rails of the integrated circuits. First and second current shunt paths between the power rails are maintained nonconductive during normal circuit operation. The ESD protection circuit of Lee causes the first and second current shunt paths to be triggered to a conductive mode in response to an ESD event on the power rails. A triggering circuit to trigger the first and second shunt paths employs a logic gate such as an inverter. The input of the inverter is coupled to the positive power rails and will maintain a low level output during normal operation. The inverter provides a high output in response to an ESD event on the power rail to trigger the first and second shunt paths.

U.S. Pat. No. 5,532,178 (Liaw et al.) teaches an improved process and integrated circuit having CMOS (NMOS and/or PMOS) devices formed on a substrate with an NMOS electrostatic discharge circuit. The NMOS ESD circuit is formed in a P well on the substrate. The improvement includes an ESD NMOS circuit having an undoped polysilicon gate electrode, and the NMOS FET devices having n-type doped gate electrodes. The undoped polysilicon gate electrode of the electrostatic discharge transistor increases the gate oxide breakdown voltage thus making the ESD transistor able to withstand a greater voltage discharge and therefore providing better protection to the product devices.

U.S. Pat. No. 5,689,133 (Li et al.) describes an ESD protection circuit combines a split bipolar transistor with a transistor layout, which exhibits very high tolerance to ESD events. The split bipolar transistor divides current among many segments and prevents the current hogging which often causes an ESD failure. Several splitting structures are disclosed. The split bipolar transistor structures each combine a resistor in series with each segment to distribute current evenly. The transistor takes advantage of the snapback effect to increase current carrying capacity. Layout positions metal contacts away from regions of highest energy dissipation. Layout also allows high currents to be dissipated through ESD protection structures and not through circuit devices such as output drivers or through parasitic bipolar transistors not designed for high current. Sharp changes in electron density are avoided by the use of high-diffusing phosphorus in N-regions implanted to both lightly and heavily doped levels. Critical corners are rounded rather than sharp. Certain P-type channel stop implants are positioned away from nearby N-regions to increase breakdown voltage.

SUMMARY OF THE INVENTION

It is an object of this invention to provide a NMOS FET device structure that when connected between an input/output pad on a semiconductor substrate and a reference voltage source, it will protect internal circuits formed on the semiconductor substrate from overstress due to excessively high voltages from an ESD voltage source.

Another object of this invention is to provide an ESD protection device that has a uniform discharge current to prevent damage to the ESD protection device thus allowing increased protection to the internal circuits.

To accomplish these and other objects an ESD protection device is formed on a semiconductor substrate. The ESD protection device connected between the junction of an input/output pad and internal circuitry with a reference voltage source. The ESD protection device prevents damage to the internal circuitry during application of an ESD voltage source to the input/output pad by conducting an ESD current uniformly from the ESD voltage source to the reference voltage source. The ESD protection device has at least one source region of a material of a first conductivity type implanted into the surface of the semiconductor substrate at a first distance and connected to the reference voltage source and at least one drain region of the material of the first conductivity type implanted into the surface the semiconductor substrate at a second distance from each other and between the plurality of source region, at a third distance from the source regions and connected to the junction of the input/output pad and the internal circuitry. The ESD protection device further has at least one gate electrode formed by the deposition of a conductive material such as highly doped polycrystalline silicon upon an insulating material formed at the surface of the semiconductor substrate above a channel region. The channel region is the region is between each of the source regions and the drain regions. The gate electrodes are connected to the reference voltage source. Each gate electrode has a gradually variable length and thus the channel region has a gradually variable length.

The ESD protection device has at least one parasitic bipolar transistor. Each parasitic bipolar transistor having a collector that is a portion of one of the drain regions, an emitter that is a portion of one of the source regions adjacent to the one drain region, and a base that is a portion of the channel region between the one drain region and the one source region. The ESD current is distributed uniformly over the channel region.

The ESD protection device also has at least one parasitic resistor formed of a bulk resistance of the semiconductor substrate and connected from the bases of the parasitic transistors connected to the reference voltage source.

The ESD protection device further optionally has a well of a material of the second conductivity type implanted into the surface of the semiconductor substrate and into which the plurality of source regions and the plurality drain regions are implanted. Or optionally, the semiconductor substrate is of the material of the second conductivity type, and the ESD protection device is formed in the surface of the semiconductor substrate.

The variable length of the gate electrodes varies from a minimum that is approximately a minimum feature size able to be formed on the semiconductor substrate to a maximum that is from approximately two times to approximately three times the minimum feature size.

BRIEF DESCRIPTION OF THE DRAWINGS

FIG. 1a is a schematic drawing of a model of an application of an ESD protection device of the prior art.

FIG. 1b is a diagram of a top surface of a NMOS FET ESD protection device of the prior art.

FIG. 1c is a diagram of a cross-section of the NMOS FET ESD protection device of the prior art.

DETAILED DESCRIPTION OF THE INVENTION

Figure 2A:
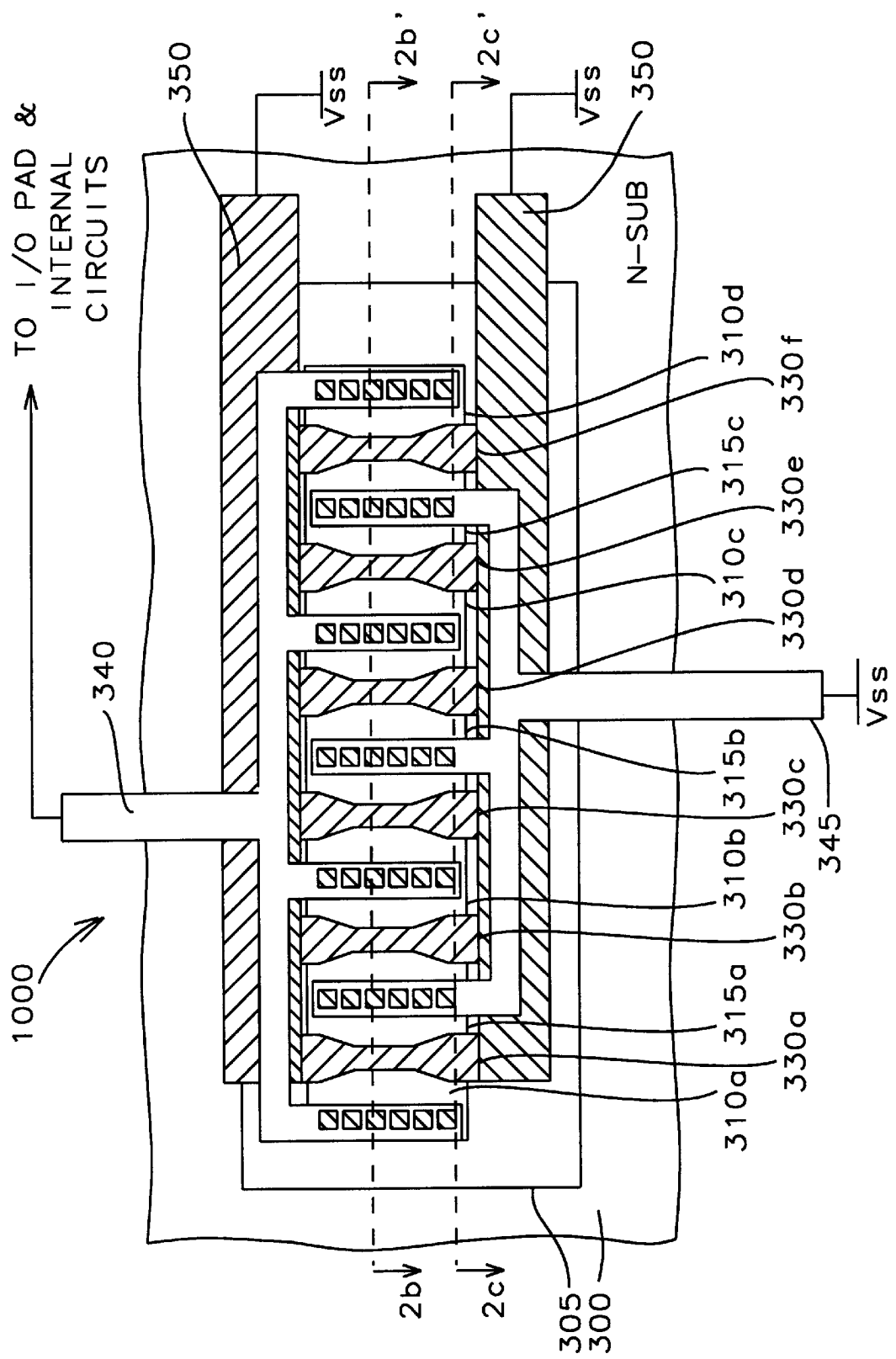
FIG. 2a is a diagram of the top surface of a NMOS FET ESD protection device of this invention.
Figure 2B:
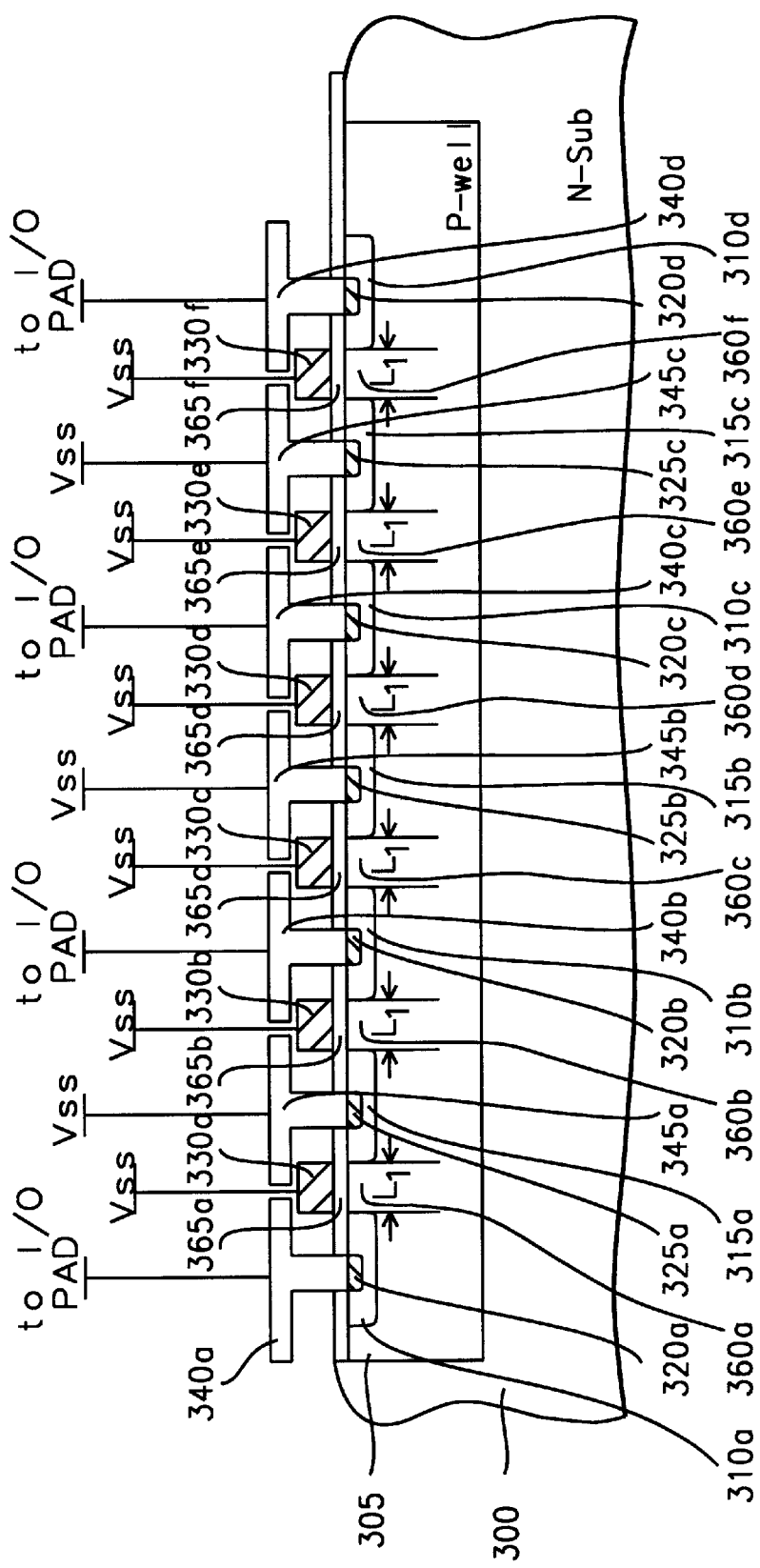
FIG. 2b is a diagram of the cross-section of the NMOS FET ESD protection device of this invention at a minimum gate length.
Figure 2C:
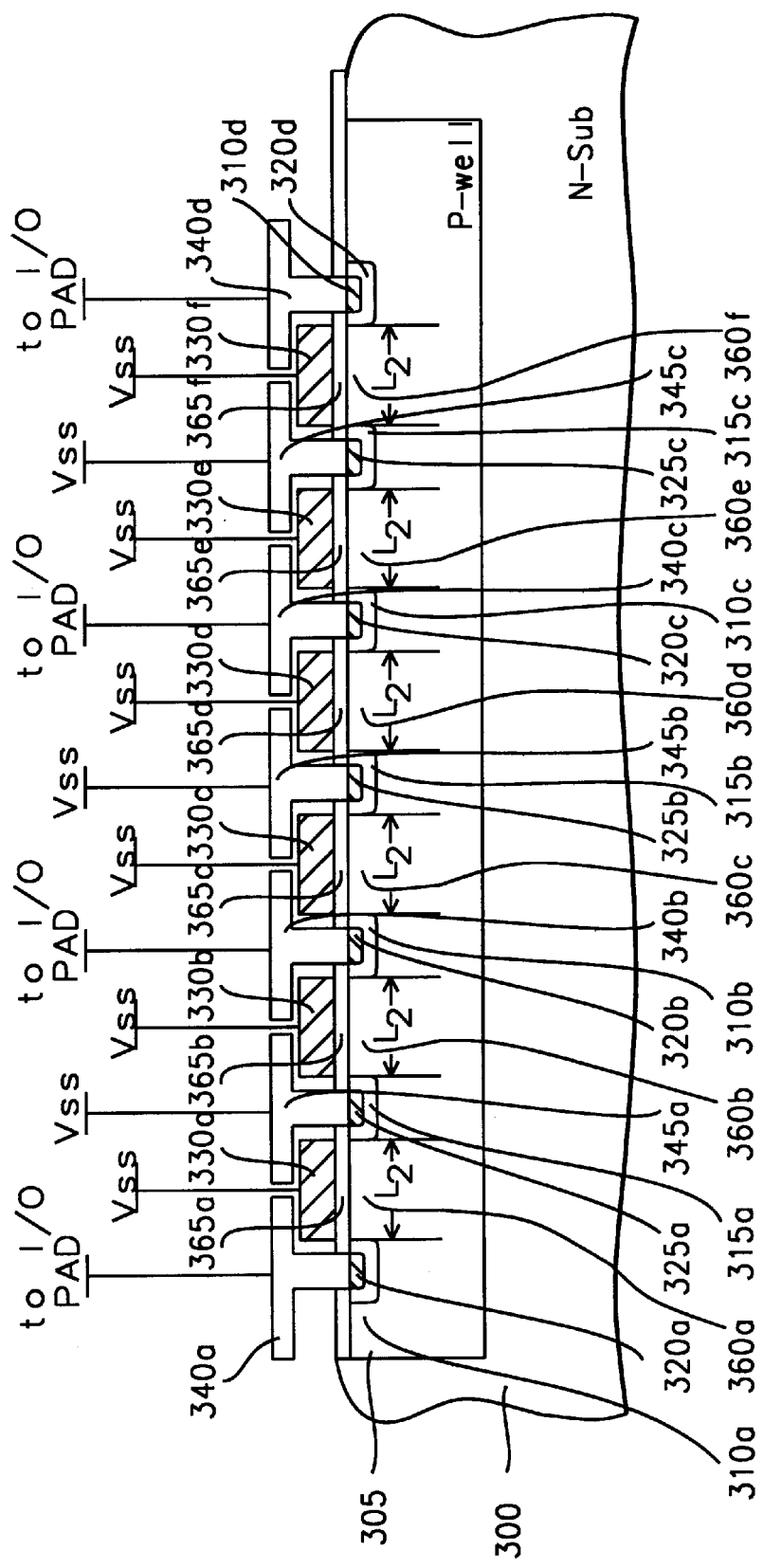
FIG. 2c is a diagram of the cross-section of the NMOS FET ESD protection device of this invention at a maximum gate length.

The NMOS FET 1000 of this invention as shown in FIGS. 2a, 2b, and 2c functionally replaces the NMOS FET 100 of the prior art in FIG. 1a. A P-well 305 is formed in the n-type substrate 300 by implanting a p-type material to a low concentration into the surface of the semiconductor substrate 300. An N-type material is then implanted to a high concentration into the surface of the semiconductor substrate to form the drain regions 310a, 310b, 310c, 310d.

The drain regions are placed at an equal distance from each other sufficient to allow the simultaneous implantation of the N-type material to a high concentration to form the source regions 315a, 315b, 315c. The source regions 315a, 315b, 315c are equally spaced from the drain regions 310a, 310b, 310c, 310d to form separate fingers of rows of the drain regions 310a, 310b, 310c, 310d and the source regions 315a, 315b, 315c. The space within the semiconductor substrate 300 between each of the drain regions 310a, 310b, 310c, 310d and the source regions is one channel region of the group of channel regions 360a, 360b, 360c, 360d, 360e, 360f.

Above each of the channel regions 360a, an insulating material such as silicon dioxide is formed to create the gate oxides 365a, 365b, 365c, 365d, 365e, 365f. A conductive material such as highly doped polycrystalline silicon is deposited on the gate oxides 365a, 365b, 365c, 365d, 365e, 365f to form the gate electrode 330a, 330b, 330c, 330d, 330e, 330f.

The N-type material is implanted to a very high concentration to form respectively the drain contacts 320a, 320b, 320c, 320d and the source contacts 325a, 325b, 325c within the drains 310a, 310b, 310c, 310d and the sources 315a, 315b, 315c. A second conductive material such as aluminum is deposited on the drain contacts 320a, 320b, 320c to form the connective lands 340 that connect the drain regions 310a, 310b, 310c, 310d to the input/output pad and the internal circuitry. Simultaneously, the second conductive material is deposited on the source contacts 325a, 325b, 325c to form the connective lands 345 that connect the source regions 315a, 315b, 315c to the substrate biasing voltage source Vss.

The first conductive material is formed on the surface of the semiconductor substrate to form the connection 350 to the gates 330a, 330b, 330c, 330d, 330e, 330f together and to the substrate biasing voltage source Vss.

The gates 330a, 330b, 330c, 330d, 330e, 330f each have a uniformly variable gate length. FIG. 2b shows the cross-section of the NMOS FET ESD protection device where the gates 330a, 330b, 330c, 330d, 330e, 330f have a first length equal to L1. FIG. 2c shows the cross-section of the NMOS FET ESD protection device where the gates 330a, 330b, 330c, 330d, 330e, 330f have a second length equal to L2. As is shown in FIG. 2a, the distance from where the gates 330a, 330b, 330c, 330d, 330e, 330f are at the first length L1 and the second length L2 is such that the gate length varies uniformly from the first length L1 and the second length L2 so as to avoid an abrupt change in gate length. Since the gate length L1 and L2 is uniformly variable, the length of the channel regions 360a, 360b, 360c, 360d, 360e, 360f is also varied in a nearly uniform manner from the minimum length L1 to the maximum length L2. The minimum length L1 will approach the minimum feature size capable of the semiconductor processing. In the present technology, that is from approximately 0.25 μm to approximately 0.35 μm. The maximum length L2 is from approximately two to approximately three times the minimum feature size or from approximately 0.50 μm to approximately 1.05 μm.

The parasitic BJT's 140a, 140b, 140c, 140d, as described in FIG. 1 are formed similarly. The drain regions 310a, 310b, 310c, 310d, 310e, 310f are the collectors of the parasitic transistors. The source regions 315a, 315b, 315c form the emitters of the parasitic transistors. And the channel regions 360a, 360b, 360c, 360d, 360e, 360f are the bases of the parasitic transistors.

Figure 3:
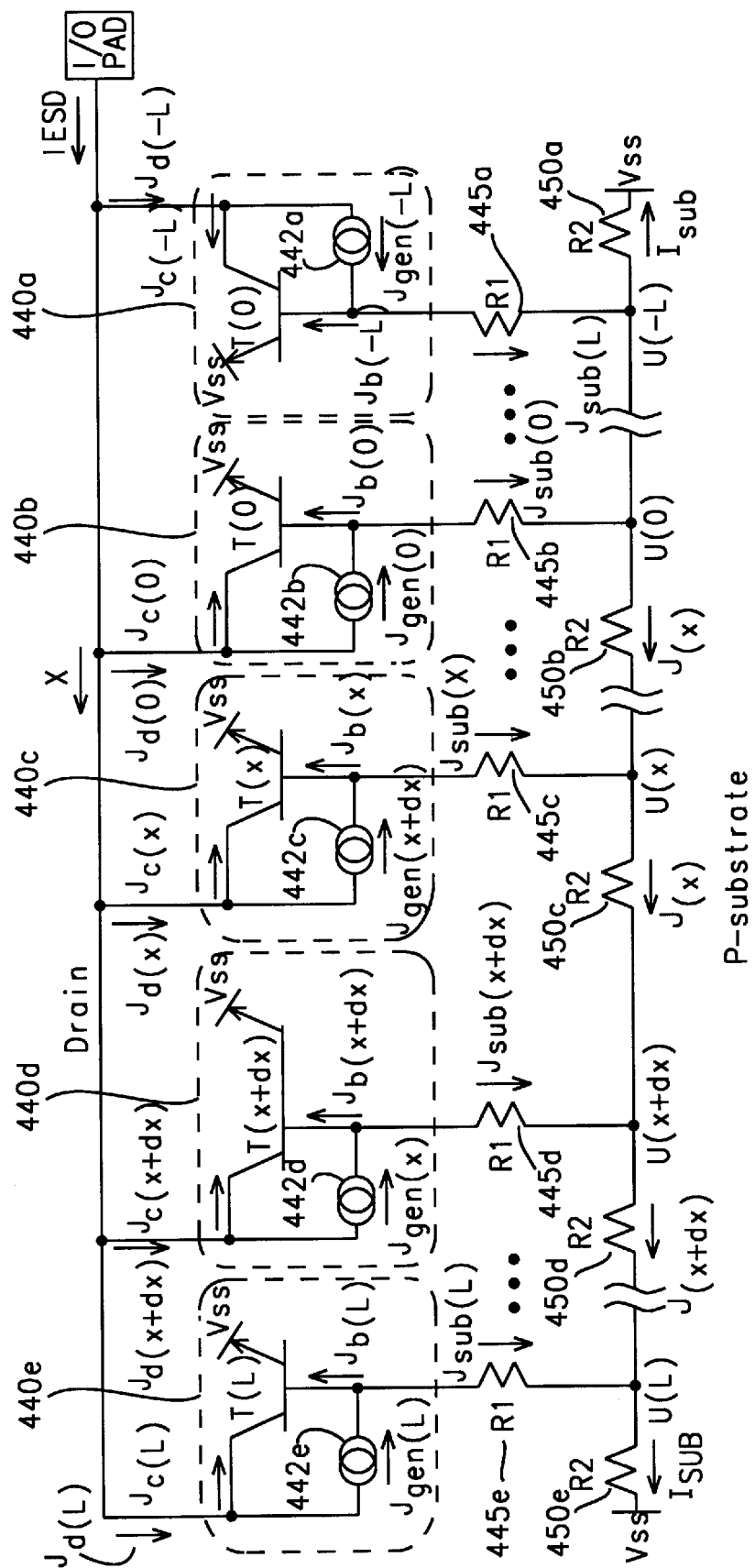
FIG. 3 is a schematic diagram of a model representing the parasitic transistor structure of the NMOS FET ESD protection device of this invention during application of an ESD voltage source to an input/output pad.

The parasitic transistors 145a, 145b, 145c, 145d of FIG. 1a represent the parasitic transistors formed between each of the drain regions 310a, 310b, 310c, 310d and each adjacent source region 315a, 315b, 315c. However, due to the variability of the length of the channel regions 360a, 360b, 360c, 360d, 360e, 360f, each parasitic transistor such as 145a, 145b, 145c, 145d of FIG. 1a can be considered multiple parasitic transistors connected in parallel and having a uniformly variable base length as shown in FIG. 3. The parasitic BJT's 440a, 440b, 440c, 440d 440e have a base length that is equivalent to the channel length and varies in a uniform fashion from the maximum L2 to the minimum L1 as shown in FIGS. 2a and 2b.

It is well known in the art that the turn-on time $\tau_{BF}$ for a transistor is:

$$\tau_{BF} = \frac{X_B^2}{2D_B} \qquad \text{Eq. 1}$$

Where:

$X_B^2$ is the length of the base.

$D_B$ is the diffusion constant of the material of the base (channel region).

Having a uniformly variable base length, each of the parasitic BJT's 440a, 440b, 440c, 440d, 440e will turn on at a different time.

However, as the ESD current flows into the drain regions 310a, 310b, 310c, 310d, the ESD current will arrive at the collectors of the parasitic BJT's 440a, 440b, 440c, 440d at various times. The first parasitic BJT 440a, 440b to receive the ESD current will be those closest to the connecting lands 340 directly connected to the input/output pad. Therefore, if the channel length is longest L2 for the parasitic BJT's 440a, 440b nearest the input/output pad, the parasitic BJT's 440a, 440b, will turn on slower than the parasitic BJT's 440d, 440e with a shorter channel length L1. Thus the parasitic BJT's 440d, 440e having the shortest base length are placed farthest from the ESD voltage source. This arrangement of the parasitic BJT's 440d, 440e with shortest base length being farthest from the ESD voltage source, and the parasitic BJT 440a, 440b that have the longest base length being closest to the ESD voltage source, causes the parasitic BJT's 440a, 440b, 440c, 440d to turn on nearly simultaneously causing a uniform current through the NMOS FET ESD protection device.

The mechanism for turning on the parasitic BJT's 440a, 440b, 440c, 440d, 440e is as described above for FIG. 1a. The junction between the drain regions 310a, 310b, 310c, 310d and the substrate 300 begin avalanche breakdown generating an electron-hole current in the substrate 300. This is represented by the current sources Jgen 442a, 442b, 442c, 442d, 442e. The current Jgen is divided to become the base current Jb for the parasitic transistors 440a, 440b, 440c, 440d, 440e and the components Jsub and Jx of the substrate current Isub. As described above, the voltage developed at the base of each of the parasitic transistors 440a, 440b, 440c, 440d, 440e directly effects the magnitude of the collector current Jc. By delaying the turn on of the parasitic transistors 440a, 440b, the collector currents Jc of the remaining parasitic BJT's 440c, 440d, 440e have a magnitude matching the collector currents Jc of the parasitic BJT's 440a and 440b. This avoids the above described current crowding and provides uniform current through out the NMOS FET ESD protection device.

Figure 4:
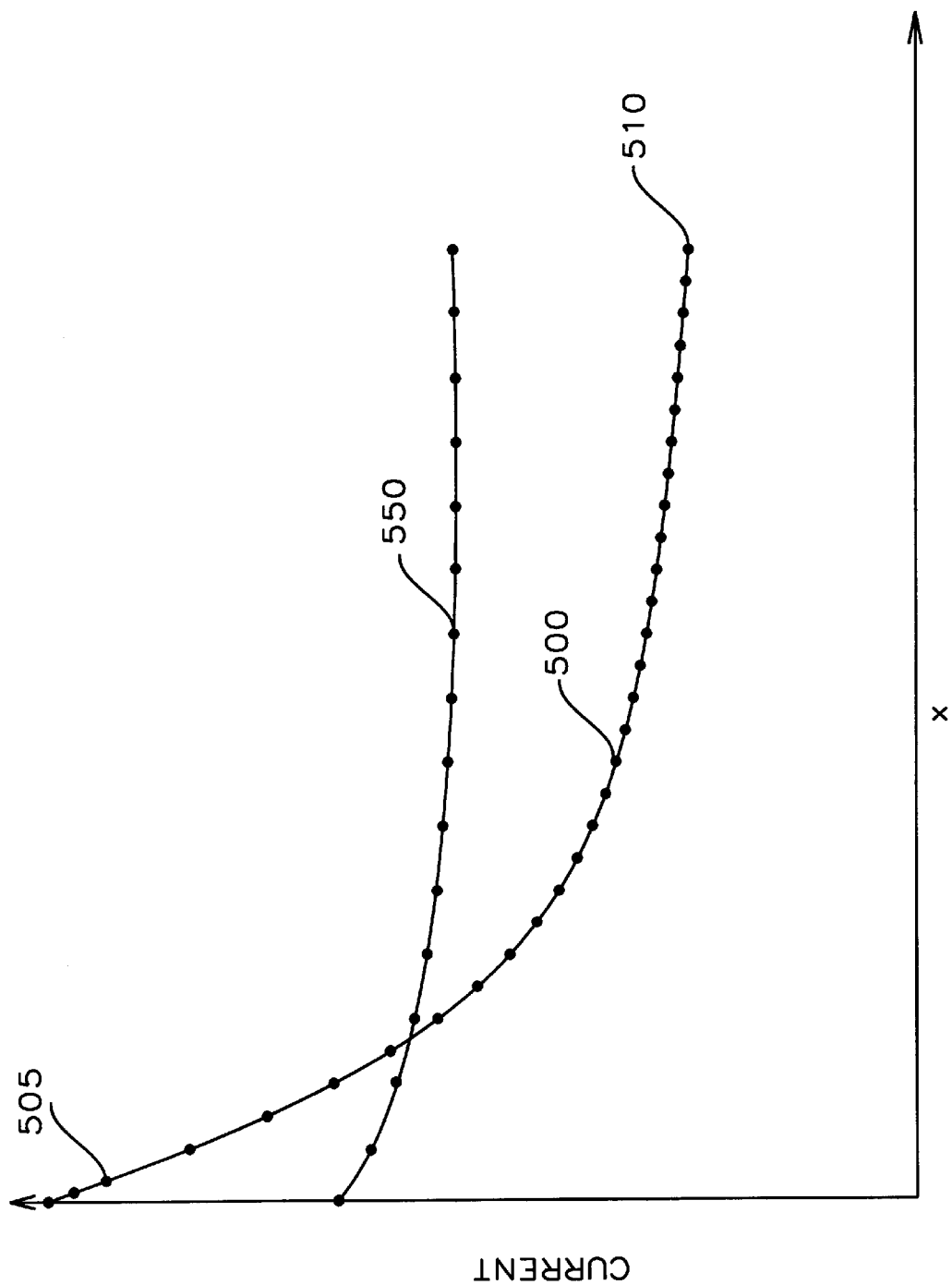
FIG. 4 is a plot of ESD current versus distance from the point of application of the ESD voltage source of the prior art and of this invention.

FIG. 4 shows the distribution of collector current Jc of the parasitic BJT's versus their distance X from the input/output pad and the ESD voltage source. The plot 500 of the current through the NMOS FET ESD protection device of the prior art has an excessively high current near the input/output pad and the ESD voltage source. This current then trails off to a marginal current 510 for those parasitic transistors farthest from the input/output pad. The plot 550 shows that the current is relatively uniform across all of the parasitic BJT's.

The multiple parasitic BJT's 140 of FIG. 1a, having the NMOS FET 1000 of FIG. 2a, have large base widths near the channel edges as shown in FIG. 2a. According to Eq. 1, those parasitic BJT's with narrower base width turn-on faster than those with a wider base width near the channel edge. The delay in turn-on of those parasitic BJT's near the channel edge causes the relatively uniform current distribution across all the parasitic bipolar transistors. The more uniform the current results in a sufficiently large ESD current to rapidly discharge the ESD voltage source having larger voltage levels than the prior art. This will prevent damage to internal circuits of an integrated circuit that is exposed to the larger voltage present on the ESD voltage source.

Returning to FIGS. 2a and 2b, it will be apparent to those skilled in the art that the semiconductor substrate 300 can be implanted with the p-type material to have an epitaxial area covering the entire semiconductor substrate 300 and the p-well 305 can be eliminated. Further, it will be apparent to those skilled in the art that the species of the implant materials can be reversed to crate a P-channel MOS FET. The P-channel MOS FET is then substituted for the PMOS FET 105 of FIG. 1a.

While this invention has been particularly shown and described with reference to the preferred embodiments thereof, it will be understood by those skilled in the art that various changes in form and details may be made without departing from the spirit and scope of the invention.

The Invention claimed is:

1. A method to fabricate an ESD protection device that prevents damage to internal circuitry formed on a semiconductor substrate during application of an ESD voltage source to said internal circuitry through an input/output pad connected the internal circuitry by conducting an ESD current uniformly through said ESD protection device to a reference voltage source, whereby said method to fabricate comprises the steps of:

providing said semiconductor substrate;

implanting a material of a first conductivity type to a low concentration into a surface of the semiconductor substrate to form an epitaxial area, whereby said epitaxial area has a bulk resistance that forms at least one parasitic resistor;

implanting a material of a second conductivity type to a high concentration into the surface of the semiconductor substrate within the epitaxial area to form at least one source region placed at a first distance from each other source region, whereby a portion of each source region forms an emitter of a parasitic transistor of at least one parasitic transistors;

implanting the material of the second conductivity type to a high concentration into the surface of the semiconductor substrate within the epitaxial area and between the plurality of source regions such that each drain region is a second distance from each source region, whereby a portion of each drain region forms a collector of the parasitic transistor of the plurality of parasitic transistors;

forming an insulating layer on the surface of said semiconductor substrate above a channel region that is between each of the source regions and the drain regions to form a gate oxide, whereby a portion of the channel region forms a base of the parasitic transistor of the plurality of parasitic transistors;

depositing a conductive material on the gate oxide to form a gate electrode, whereby each gate electrode and thus each channel region channel length varies gradually and not abruptly from a first length to a second length;

connecting each of the source regions to the reference voltage source;

connecting each of the drain regions to a junction of the input/output pad and the internal circuitry; and connecting each of the gate electrodes to said reference voltage source.

2. The method of claim 1 whereby the epitaxial area is over the surface of the entire semiconductor substrate.

3. The method of claim 1 wherein the epitaxial area is a well within the surface of the semiconductor substrate, whereby the semiconductor substrate is implanted with the material of the second conductivity type to a low concentration.

4. The method of claim 1 wherein the first length is approximately a minimum feature size able to be formed on said semiconductor substrate and the second length is from approximately two times to approximately three times said minimum feature size.

* * * * *